(12) United States Patent
Ostrogorska et al.

(10) Patent No.: US 9,279,836 B2
(45) Date of Patent: Mar. 8, 2016

(54) DEVICE FOR MEASURING THE DIRECT COMPONENT OF ALTERNATING CURRENT

(71) Applicant: ABB TECHNOLOGY AG, Zurich (CH)

(72) Inventors: Magdalena Ostrogorska, Krakow (PL); Filip Grecki, Gdansk (PL); Marcin Szewczyk, Warszawa (PL); Wojciech Piasecki, Krakow (PL); Przemyslaw Balcerek, Krakow (PL); Marek Fulczyk, Kedzierzyn-Kozle (PL)

(73) Assignee: ABB TECHNOLOGY AG, Zurich (CH)

( * ) Notice: Subject to any disclaimer, the term of this patent is extended or adjusted under 35 U.S.C. 154(b) by 8 days.

(21) Appl. No.: 13/948,233

(22) Filed: Jul. 23, 2013

(65) Prior Publication Data
US 2014/0028303 A1 Jan. 30, 2014

(30) Foreign Application Priority Data
Jul. 27, 2012 (EP) .................................... 12460047

(51) Int. Cl.
*G01R 19/20* (2006.01)
*G01R 15/18* (2006.01)

(52) U.S. Cl.
CPC .............. *G01R 19/20* (2013.01); *G01R 15/185* (2013.01)

(58) Field of Classification Search
CPC ...... G01R 15/202; G01R 15/207; G01R 1/18; G01R 33/07; G01R 33/072
See application file for complete search history.

(56) References Cited

U.S. PATENT DOCUMENTS

| | | | | |
|---|---|---|---|---|
| 4,682,101 A | | 7/1987 | Cattaneo | 324/117 H |
| 5,446,377 A | * | 8/1995 | Mohri et al. | 324/207.13 |
| 6,768,232 B1 | * | 7/2004 | Kalsi | 310/52 |
| 7,057,384 B2 | * | 6/2006 | Wobben | G01R 15/202 |
| | | | | 324/117 H |
| 7,557,563 B2 | * | 7/2009 | Gunn | G01R 1/22 |
| | | | | 324/117 H |
| 8,238,066 B2 | * | 8/2012 | Zylstra | 361/42 |
| 8,896,290 B2 | * | 11/2014 | Hammond | 324/117 H |
| 2006/0284647 A1 | * | 12/2006 | Gunn | G01R 1/22 |
| | | | | 324/126 |
| 2009/0295384 A1 | * | 12/2009 | Teppan | G01R 33/04 |
| | | | | 324/253 |
| 2012/0268108 A1 | * | 10/2012 | Hozoi | G01R 15/202 |
| | | | | 324/202 |

FOREIGN PATENT DOCUMENTS

| | | | | |
|---|---|---|---|---|
| GB | 2 370 363 A | | 6/2002 | G01R 15/15 |
| JP | 09166626 A | | 6/1997 | G01R 15/18 |

OTHER PUBLICATIONS
Search report mailed Dec. 20, 2012 in corresponding application No. EP 12460047.
Written Opinion mailed Dec. 20, 2012 in corresponding application No. EP 12460047.

* cited by examiner

*Primary Examiner* — Alesa Allgood
(74) *Attorney, Agent, or Firm* — Renner Kenner Greive Bobak Taylor & Weber

(57) ABSTRACT

The invention relates to a device for measuring the direct component of alternating current, applicable in current measuring systems where a low direct component of alternating current and a high amplitude of the alternating component of alternating current occur. The device for measuring the direct component of alternating current comprises a current-carrying wire (1) around which there is located a magnetic core (2) provided with a gap (3) in which a magnetic field sensor (4) with insulated terminals (5) is located and it comprises a shorted compensating winding (6) or (9) which is made in the form of a single turn coil placed on the core (2).

3 Claims, 2 Drawing Sheets

DEVICE FOR MEASURING THE DIRECT COMPONENT OF ALTERNATING CURRENT

CROSS-REFERENCE TO RELATED APPLICATION

This application claims priority of European patent application No. 12460047.9 filed on Jul. 27, 2012, and which is incorporated herein by reference.

TECHNICAL FIELD

The invention relates to a device for measuring the direct component of alternating current, applicable in current measuring systems where a low direct component of alternating current and a high amplitude of the alternating component of alternating current occur.

BACKGROUND ART

Systems comprising a conductor with measured current, a magnetic circuit in the form of a magnetic core with a gap located around the conductor with the current, and a magnetic field sensor located in the magnetic core gap belong to the most popular current measuring systems. These systems operate without a feedback control loop. If the measuring system is furnished with a secondary winding located on the magnetic core, which winding is connected with a magnetic field sensor and with an additional power supply system which forces the flow of current in the secondary winding, then this is a system operating with a feedback control loop.

The above mentioned systems provide a satisfactory measuring range for a vast array of applications. Their feature is the representation of the value and waveform of the measured current in the conductor in the form of a voltage or current signal. The output signal of these measuring systems is proportional to the measured current, both for the direct component and the alternating component. The direct component means current of a value that is constant in a given, finite time interval, whereas an alternating component means current of a value alternating periodically in a given time interval. The traditional system with feedback is shown in the state of the art in U.S. Pat. No. 4,682,101. A conductor with a measured current is placed in the magnetic core window. The magnetic core is placed coaxially with the conductor and it has an air gap in which a magnetic field sensor is placed. The signal from the field sensor is supplied to a signal conversion/amplification system and then to a secondary winding wound on the core and further to the measuring system connected to the secondary winding.

The disadvantage of the above described solution is that if there is a large disproportion between the direct component and the alternating component of the measured current, by way of example, in the order of 10,000 times, a very precise measuring system of a great measurement resolution is required. In such systems, the measured signal from the direct component which is several orders of magnitude lower can be at the level of noise of the conversion system, which in the worst case makes it impossible to measure the direct component. In cases where direct component measurement is significant while a precise measurement of the alternating component is not required, the above described disadvantage is of basic importance.

SUMMARY OF THE INVENTION

The essence of the device for measuring the direct component of alternating current using a current-carrying wire around which there is located a magnetic core provided with a gap in which a magnetic field sensor with insulated terminals is located is that it comprises a shorted compensating winding which is made in the form of a single turn coil placed on the core.

Preferably, the shorted compensating winding has the form of a tubular conducting ring.

Preferably, the tubular conducting ring has the shape of a torus made of two halves, the upper one and the bottom one, which are mechanically and electrically permanently connected with each other.

Alternatively, the shorted compensating winding has the form of a coil, made in the shape of a torus, which is formed of two halves of a tubular conducting ring of a mesh structure, permanently connected with each other both mechanically and electrically.

Preferably, the shorted compensating winding is made of copper or aluminum.

Preferably, there is an insulating layer between the inner surface of the ring and the outer surface of the core.

The advantage of the system of the device according to the invention is its simple design allowing precise measurement of the direct component of alternating current in cases where the value of the alternating component is many times larger, even if the value of the direct component is less than 0.01 of the alternating component.

BRIEF DESCRIPTION OF THE DRAWINGS

The device according to the invention is shown as an example of an embodiment in the drawing where.

BEST MODE FOR CARRYING OUT THE INVENTION

Figure 1:
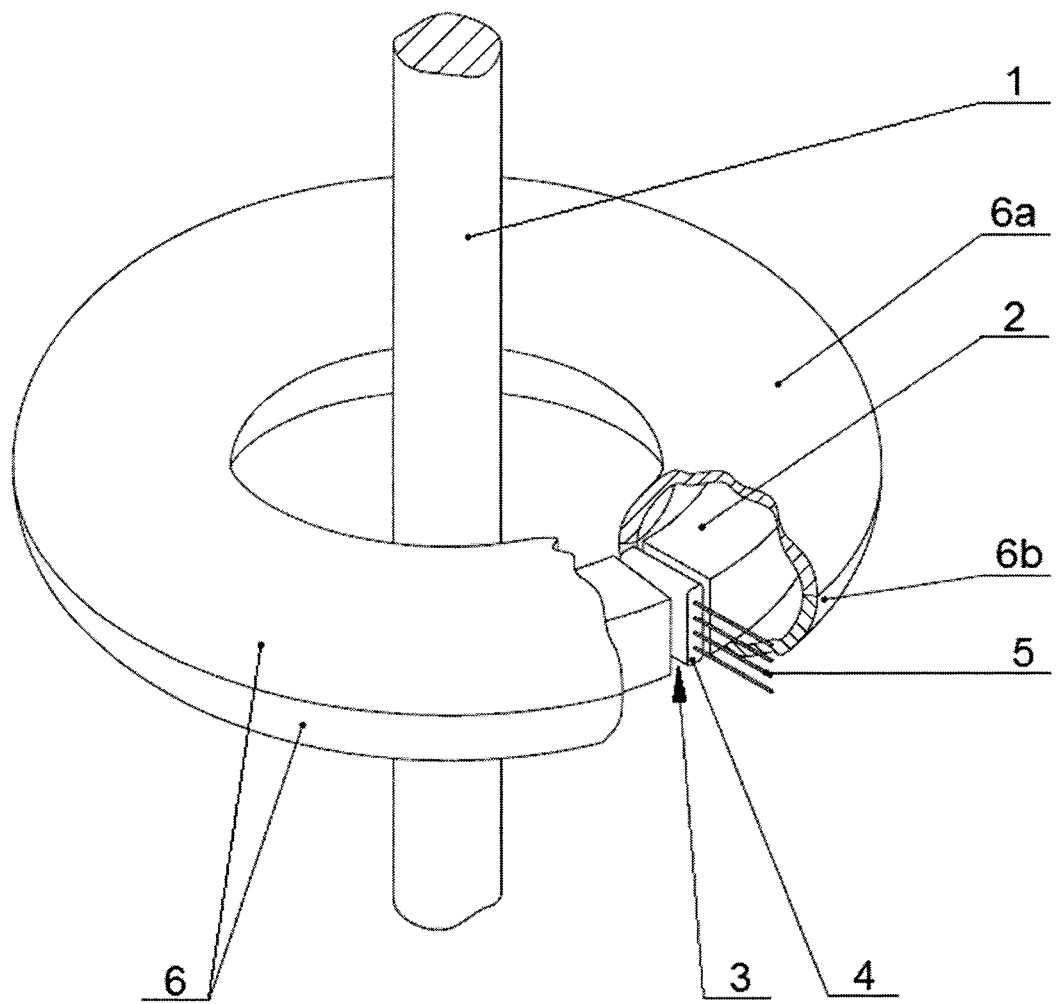
FIG. 1 shows the device in perspective view, with a partially broken-out section showing the location of the measuring sensor, in the first form of the embodiment, FIG. 2—a fragment of the surface from the broken-out section in FIG. 1, within the core gap, in frontal view, and FIG. 3—the device in perspective view in the second form of the embodiment of the invention.
Figure 2:
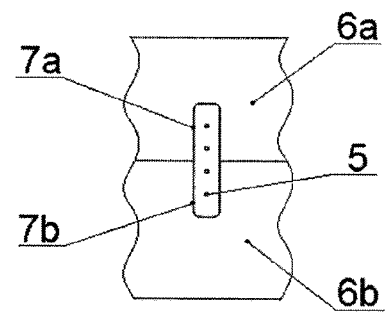
Figure 3:
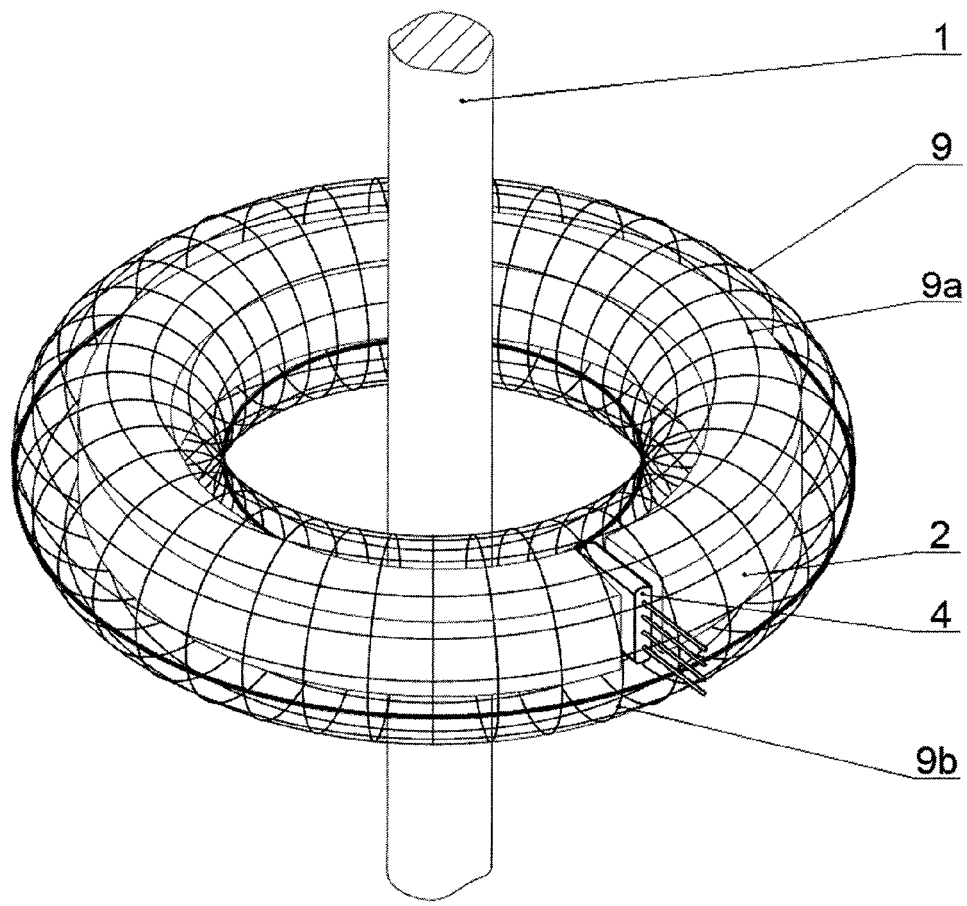

The device for measuring the direct component of alternating current comprises a current-carrying wire 1 around which there is located a magnetic core 2 provided with a gap 3. In the gap in the core 2 there is located a magnetic field sensor 4 with insulated terminals 5 through which the device is connected with a measuring system, not shown in the drawing. On the core 2 there is located a compensating winding which is made in the form of a single turn coil which in the first form of the embodiment has the form of a conducting tubular ring 6 in the shape of a torus composed of two halves, the upper one 6a and the bottom one 6b, permanently connected with each other mechanically and electrically along the circumference of the torus and forming a conducting screen for the core 2 and for the sensor 4 located inside of the closed, tubular ring 6. The external surfaces of the halves 6a and 6b of the ring 6 are provided with notches 7a and 7b, respectively, for placing the terminals 5 of the sensor 4 in them. In the second form of the invention embodiment, the compensating winding 9 has the form of a coil made in the shape of a torus formed by two halves 9a and 9b of a conducting tubular ring of a mesh structure, permanently connected with each other mechanically and electrically along the circumference of the torus. In this embodiment, the insulating terminals 5 of the sensor 4 are lead outside the winding 9 through the mesh of which the winding 9 is made.

In both forms of the invention embodiment, the shape of the compensating winding 6 and 9 can be different than the shape of a torus, and in particular, the cross-sections of the ring that forms this winding can have the shape of a triangle, a square, a rectangle, a hexagon etc. Similarly, the core can have different cross-sections, which does not change the essence of the invention. Depending on the shape of the cross-section of the core 2, the shape of the compensating winding should be similar in its cross-section to maintain the possibility of mutual correlation between these elements and bring their minimization.

In both forms of the invention embodiment, the core 2 is made of ferromagnetic materials characterized by high magnetic permeability, such as ferrites or cores of amorphous tapes, whereas the magnetic core sensor has the form of a Hall effect sensor of a thickness adjusted to the width of the gap 3 in the core 2, and its terminals 5 are in electric insulation. The compensating winding 6 or 9 is made of low-resistivity material, by way of example, of copper or aluminum. In all forms of the embodiment of the invention, an insulating layer can be placed between the inner surface of the ring 6 and the outer surface of the core 2, which is not shown in the drawing. The insulating layer can be made of polyester foil.

The principle of operation of the device according to the invention consists in elimination of the presence of the alternating components of current while at the same time maintaining the direct component in the magnetic flux of the magnetic circuit of the measuring system. The magnetic flux concentrated in the core 2 located in the immediate surroundings of the conductor 1 is directly proportional to current flowing in this conductor. If an additional shorted compensating winding 6 or 9 is connected into the magnetic circuit, then the voltage induced in this winding will generate a counter-flux compensating the original flux. The magnetic field present in the core 2 will be many times lower compared to a case without the compensating winding. An additional necessary condition, which has to come into existence for the induction of the electromotive force (EMF) to occur in the secondary winding, is magnetic field variation, which causes that current is induced in the shorted compensating winding, and the compensating winding will generate the counter-flux only for the alternating components. In consequence, the magnetic field observed in the gap 3 of the magnetic circuit will be reduced many times for alternating components, and will remain unchanged for the direct component. As a result, the percentage content of the direct component present in the directly measured signal, i.e. the magnitude of the magnetic field, is considerable higher than in the signal measured directly in the current-carrying wire 1. A shorted secondary winding in solid form 6 or in the form of a mesh 9 causes compensation of the magnetic flux induced from the alternating component in the magnetic core 2, whose value after compensation is close to zero.

The invention claimed is:

1. A device for measuring the direct component of alternating current, using a current-carrying wire around which there is located a magnetic core provided with a gap in which a magnetic field sensor with insulated terminals is located, characterized in that the device comprises a shorted compensating winding which is made in the form of a single turn coil placed on the core and wherein the shorted compensating winding has the form of a tubular conducting ring, characterized in that the tubular conducting ring has the shape of a torus made of two halves, an upper one and a bottom one, which are mechanically and electrically permanently connected with each other along the circumference of the torus.

2. A device according to claim 1, characterized in that the shorted compensating winding is made from a low-resistivity material such as copper or aluminum which is spaced apart from said magnetic core and has an insulating layer therebetween.

3. A device according to claim 1, characterized in that there is an insulating layer between the inner surface of the tubular conducting ring made from a low-resistivity material and the outer surface of the core.

\* \* \* \* \*